United States Patent [19]
Priddy et al.

[11] Patent Number: 5,698,168
[45] Date of Patent: Dec. 16, 1997

[54] UNIBODY GAS PLASMA SOURCE TECHNOLOGY

[75] Inventors: Scott W. Priddy, St. Louis Park; Hwa Cheng, Woodbury, both of Minn.

[73] Assignee: Chorus Corporation, White Bear Lake, Minn.

[21] Appl. No.: 551,560

[22] Filed: Nov. 1, 1995

[51] Int. Cl.[6] ..................... B01J 19/08
[52] U.S. Cl. ................. 422/186.29; 422/906
[58] Field of Search ............... 422/186.29, 906

[56] References Cited

U.S. PATENT DOCUMENTS

| | | |
|---|---|---|
| D. 282,894 | 3/1986 | Watson et al. |
| D. 295,145 | 4/1988 | Jeanjean . |
| 3,875,068 | 4/1975 | Mitzel ............... 422/186.05 |
| 4,123,316 | 10/1978 | Tsuchimoto ............... 156/643.1 |
| 4,148,705 | 4/1979 | Battey et al. ............... 204/192.35 |
| 4,178,877 | 12/1979 | Kudo ............... 118/728 |
| 4,262,631 | 4/1981 | Kubacki ............... 118/723 MP |
| 4,297,162 | 10/1981 | Mundt et al. ............... 156/643.1 |
| 4,401,054 | 8/1983 | Matsuo et al. ............... 118/723 MR |
| 4,646,680 | 3/1987 | Maki . |
| 4,976,920 | 12/1990 | Jacob ............... 422/23 |
| 5,019,117 | 5/1991 | Nakamura et al. ............... 118/723 MR |
| 5,034,604 | 7/1991 | Streetman et al. . |
| 5,158,750 | 10/1992 | Finicle . |
| 5,318,752 | 6/1994 | Visser ............... 422/83 |
| 5,432,341 | 7/1995 | Gspann . |
| 5,503,807 | 4/1996 | Griffiths et al. ............... 422/186.04 |
| 5,574,958 | 11/1996 | Kawano ............... 422/186 |

OTHER PUBLICATIONS

Crucible Weldment—175, 2.75", 4.5" CF Mount Drawing, EPI, 1290 Hammond Road St. Paul, Minnesota, drawn May 18, 1992.

*Primary Examiner*—Peter A. Nelson
*Assistant Examiner*—John R. Hardee
*Attorney, Agent, or Firm*—Skinner and Associates; Joel D. Skinner, Jr.

[57] ABSTRACT

A unibody, monolithic, one-piece PBN plasma chamber for an MBE gas plasma source. The chamber has a cylindrical configuration with at least one effusion orifice and a gas inlet opening. The gas inlet opening is preferably communicatively connected to an elongated, tubular inlet member. The inlet member is preferably coupled to a liquid cooled gas source by an intermediary connection member which is preferably constructed of a refxactory metal. The chamber minimizes leakage and maximizes efficiency. A gas plasma source assembly and a method for making the chamber are also disclosed.

6 Claims, 2 Drawing Sheets

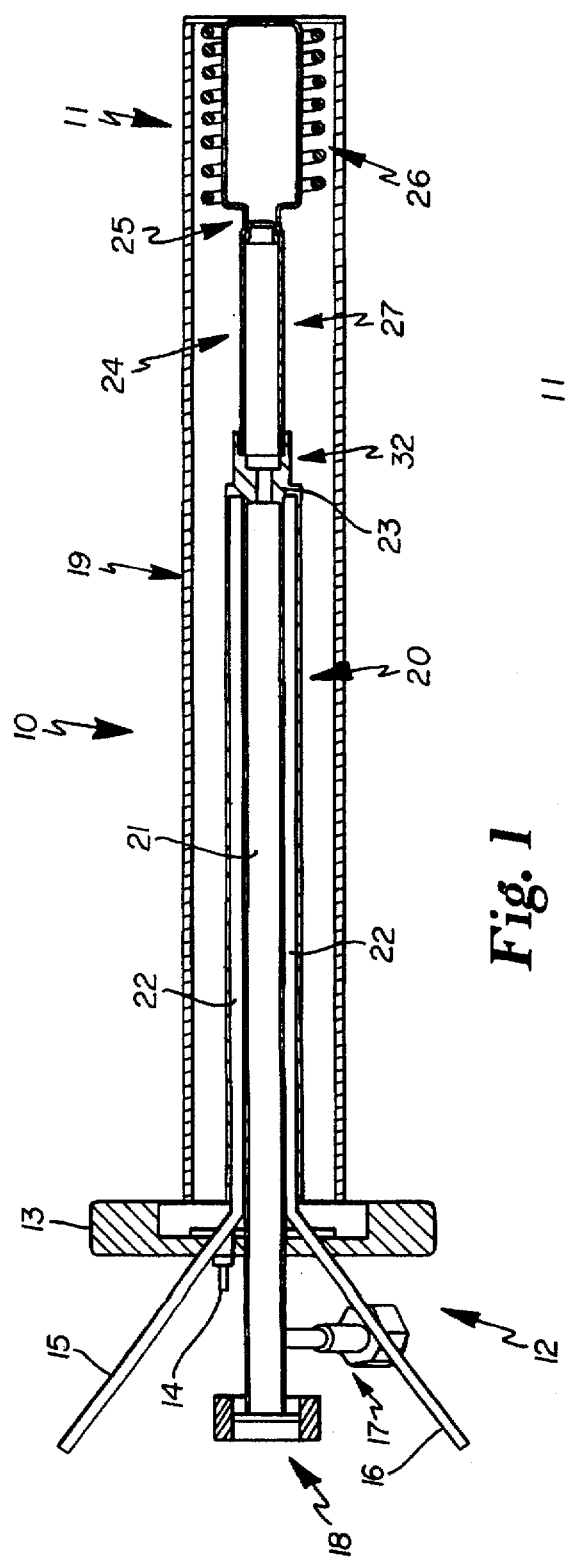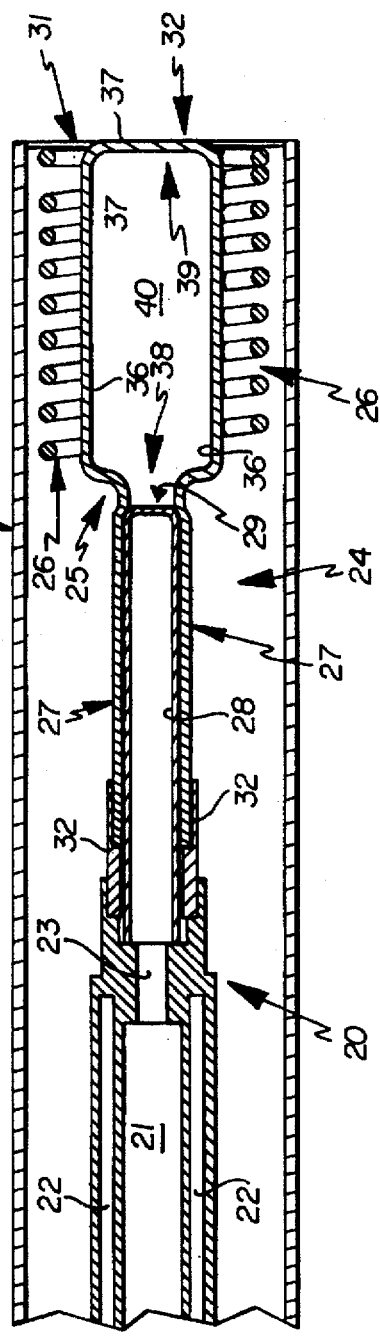

UNIBODY GAS PLASMA SOURCE TECHNOLOGY

BACKGROUND OF THE INVENTION

1. Field of the Invention

This invention relates, generally, to apparatus used in the manufacture of components in the compound semiconductor and related industries. More particularly, the invention relates to a plasma chamber for a gas plasma source.

2. Background Information

Molecular beam epitaxy is a growth process which involves the deposition of thin films of material onto a substrate in a vacuum by directing molecular or atomic beams onto the substrate. Deposited atoms and molecules migrate to energetically preferred lattice positions on the substrate, which is heated, yielding film growth of high crystalline quality, and optimum thickness uniformity. MBE is widely used in compound semiconductor research and in the semiconductor device fabrication industry, for thin-film deposition of elemental semiconductors, metals and insulating layers.

One type of apparatus utilized in MBE deposition is the gas plasma source or emitter. One such source is the RF Plasma Source produced by Oxford Applied Research. Gas plasma sources have a plasma chamber with a gas inlet attached at one end for input of a gas such as Nitrogen into the chamber. A high frequency RF coil or plate is used to crack the gas and form an active species, for example, atomic Nitrogen. The active species is effused through an output end, typically disposed opposite the gas inlet end. The output end of the emitter typically has one or more apertures. The effused species egresses through the output end apertures into an ultra high vacuum growth chamber where the species combines with other elements or compounds. An example of this process is a Nitrogen gas plasma source used to generate non-ionized $N_1$ to subsequently yield Gallium Nitride in the growth chamber.

Prior an plasma chambers are typically multi-piece structures. The various components of the structure are typically constructed of pyrolytic boron nitride (PBN). These multi-piece chamber structures have significant limitations. A primary problem is that they are prone to leaking when under pressure during operation. Leaking gas will not be cracked by the source and this results in a loss of efficiency. Other problems found in prior an sources include generation of instabilities, high levels of $N_2$ gas in the growth environment, and low levels of $N_1$.

One solution to this problem has been to use quartz to form the chamber because quartz can be shaped into a one piece design. However, for some high temperature applications, such as growth of Gallium Nitride crystals, the quartz tube can melt and lose its shape. Also, quartz can contribute Oxygen gas into the growth environment. And, Oxygen gas is unacceptable in many such applications.

Despite the need in the art for a plasma chamber design which overcomes the disadvantages, shortcomings and limitations of the prior art, none insofar as is known has been developed. Accordingly, it is an object of the present invention to provide a unibody, monolithic gas plasma chamber which maximizes efficiency and which is useable in high temperature applications.

SUMMARY OF THE INVENTION

The present invention solves the problems of the prior art by providing a unibody plasma chamber that (1) minimizes gas leakage, (2) permits optimization of output aperture number and output aperture diameter, (3) increases stability, (4) increases the partial pressure of the active species of the subject gas in the growth chamber mix, (5) increases growth yield rate, and (6) is compatible with high temperature uses.

The present invention provides a gas plasma chamber comprising a one piece, rigid wall structure constructed of PBN. The chamber has a predetermined configuration defining an interior space, the interior space having at least one first peripheral dimension, the wall structure having at least one effusion orifice and a gas inlet opening, the at least one effusion orifice having a second peripheral dimension and the gas inlet opening having a third peripheral dimension, any one second peripheral dimension and the third peripheral dimension being less than any one first peripheral dimension. In a preferred embodiment, a unitary, elongated tubular inlet member extends from the gas inlet opening for connection to a gas supply structure via an intermediary connection member constructed of a refractory metal.

The features, benefits and objects of this invention will become clear to those skilled in the art by reference to the following description, claims and drawings.

BRIEF DESCRIPTION OF THE DRAWINGS

FIG. 1 is a side view, partially in crossection of the gas plasma source of the present invention.

FIG. 2 is a crossectional view of one embodiment of the unibody, monolithic plasma chamber of the present invention.

DESCRIPTION OF THE PREFERRED EMBODIMENTS

Figure 3:
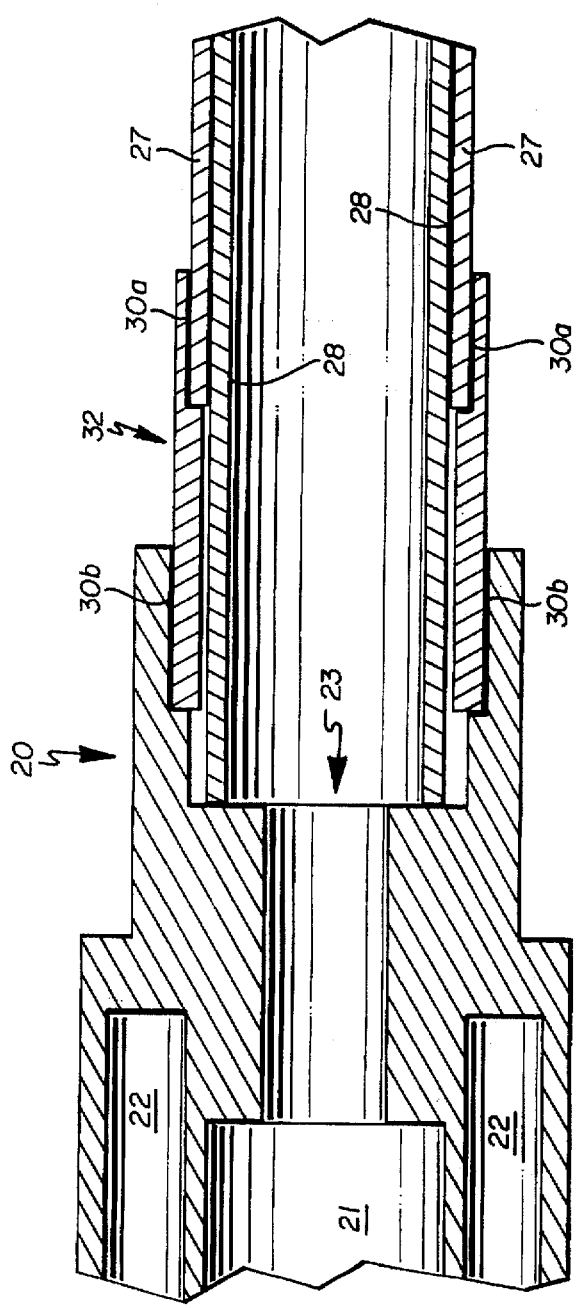
FIG. 3 is a detailed view of a portion of the gas plasma source.

1. Gas Plasma Source Design.

The chamber structure of the present invention is well suited for use in an MBE gas plasma sottree.

Referring to FIGS. 1 and 2, the plasma source 10 preferably has an elongated, cylindrical body structure comprising a distally disposed head assembly 11 connected to a proximally disposed base or mounting assembly 12.

The mounting assembly 12 couples the gas plasma source 10 to an MBE growth chamber of a known design (not shown). The base assembly 12 further supports the head assembly 11 at a predetermined position within the growth chamber. The assembly 12 comprises a mounting flange 13, a power connection 14, inlet and outlet water cooling lines 15 and 16, a gas inlet firing 17, and an optical access port 18. The power connector is coupled to an RF coil 26 disposed in the head assembly 11.

An outer housing 19 extends from the base 12 to the head 11. The housing 19 is grounded and shields the device 10, and is preferably constructed of stainless steel. A centrally disposed, elongated gas inlet tube 20 extends from the base 12 to the head 11, within the housing 19. The gas inlet tube 20 is also preferably constructed of stainless steel. The tube 20 has a central cavity 21 which is communicatively connected to the gas inlet 17. The port 18 permits viewing by a user down the length of the tube 20 cavity 21. A cooling cavity 22 is disposed about the central cavity 21. The cooling cavity 22 is communicatively connected to the inlet and outlet 15 and 16 and permits fluid flow to cool the body of the tube 20, particularly its distal end which is connected to the head assembly 11 and is exposed to relatively high temperatures. A central cavity 23 of smaller diameter than that of cavity 21 is disposed at the distal end of the tube 20, coaxially with respect to the cavity 21.

The head assembly 11 includes a central, interiorly disposed chamber 24 surrounded by an RF coil 26 and the grounded shield 19. The chamber 24 preferably has a distal, cylindrical bulb portion 25 and an elongated neck or tube portion 27 extending proximally from the bulb portion 25. Referring also to FIG. 3, the tube portion 27 is connected to the gas inlet tube 20, preferably by an intermediary connector 32. The tube 27 has a predetermined length and further has an interior cavity 29 which preferably has a larger interior dimension than that of the inlet tube 20 cavity 23 to provide positive gas pressure distally. A baffle 28 is preferably disposed in the tube 27. The baffle 28 is preferably constructed of PBN and functions to maintain a higher gas pressure on its proximal or inlet side relative to its distal or bulb side, and to provide a physical plasma barrier. The tube 27 proximal end is connected to the distal or terminal end of the connector 32 and the gas inlet 20 to the proximal end of the connector by braze connections 30 a and b to create a hermetic seal. The intermediary connector 32 is constructed of a refractory metal, preferably Tantalum. The connector 32 provides a strong, ductile, low coefficient of thermal expansion member between the brittle, low coefficient of thermal expansion PBN tube portion 27 and the high coefficient of thermal expansion stainless steel inlet 20.

The coil 26 is inductive coupled. The coil 26 is preferably constructed of Copper or a similarly conductive material. The coil 26 is disposed exteriorly, a predetermined distance from the chamber 24, substantially along its longitudinal dimension. The coil 26 is connected to the power connector 14. The coil 26 cracks gas in the chamber 24 via a high frequency RF field.

2. Chamber Structure.

One embodiment of the unibody chamber 24 of the present invention is shown in FIGS. 1 and 2. The chamber 24 bulb portion 25 has a cylindrical configuration with a straight side wall portion 36 of a predetermined length, a straight, flat end wall portion 37, and a gas inlet opening 38 of a predetermine diameter disposed opposite the end wall portion 37 and leading to the tube potion 27 of the chamber 24. At least one effusion orifice 39 of a predetermined diameter is disposed in the end wall portion 37. The inlet orifice 38 permits gas to enter an interior plasma cavity or reaction zone 40 of the bulb portion 25 where it is cracked. The tube portion 27 provides an area through which a thermal gradient is created between the hot plasma cavity bulb 25 and the water cooled gas inlet tube 20. The inlet orifice 38 is of a smaller diameter than that defined by the chamber side wall portion 36. The outlet orifice 39 permits cracked gas to effuse from the reaction zone 40. The outlet orifice 39 has a smaller diameter than that of the inlet orifice 38 and that of the reaction zone 40.

Importantly, the chamber 24 is constructed of a unitary, monolithic layer of PBN, such as Pyrosyl®. The preferred thickness of PBN for the chamber 24 is on the order of 0.035 inches (0.08 cm). PBN is inert and will not outgas oxygen. Additionally, PBN is stable at high temperatures. The chamber 24 is constructed via a chemical vapor deposition process set forth in detail below. All boundary edges between the chamber 24 wall members are preferably radius edges. The length and other dimensions of the chamber 24 may be varied consistent with the basic teachings of this invention. The unibody design minimizes gas leakage, which yields high efficiency cracking and maximum partial pressure of the active species of the subject gas effused to the growth chamber.

A flat end plate 31 is connected to the end of the housing shield 19. The plate 31 is preferably constructed of a refractory metal. Importantly, the plate 31 has an aperture 32 which is aligned with chamber orifice 39 to emit the gas species.

Figure 4:
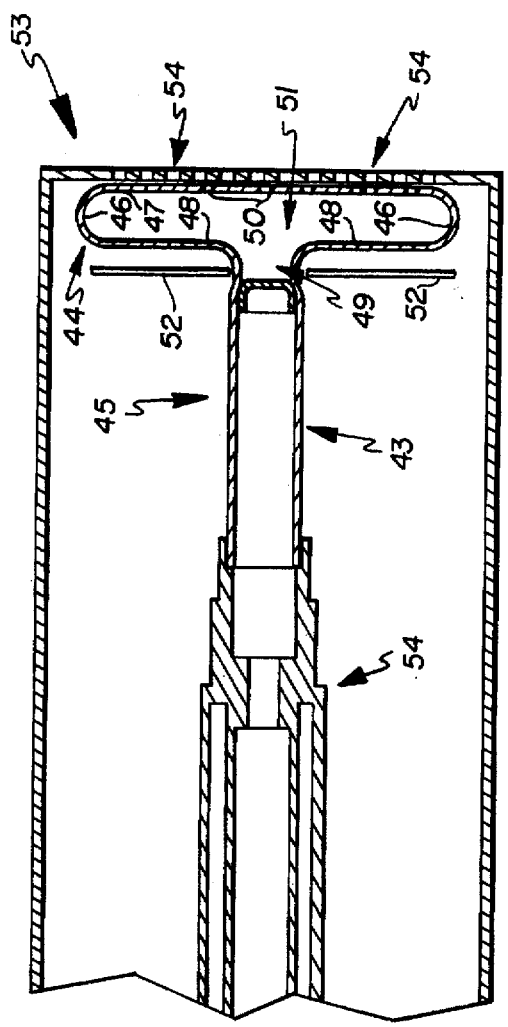
FIG. 4 is crossectional view of another embodiment of the gas plasma chamber of this invention.

Referring to FIG. 4, an alternative embodiment of the chamber 45 is shown. The chamber 45 has an elongated ingress tube portion 43 and a cylindrical bulb portion 44 with a curved side wall portion 46, straight, flat outer and inner end wall portions 47 and 48, and a gas inlet orifice 49 of a predetermine diameter disposed in the wall portion 48. A plurality of effusion orifices 50 of a predetermined uniform diameter are disposed in the end wall portion 47. The diameter and number of orifices 50 may be varied to optimize the particular application of the chamber 45. The inlet orifice 49 permits gas to enter an interior reaction zone 51 of the chamber 45. The inlet orifice 49 is of a smaller diameter than that defined by the chamber side wall portion 46. The outlet orifices 50 permit cracked gas to effuse from the reaction zone 51. The outlet orifice 50 has a smaller diameter than that of the inlet orifice 49 and that of the reaction zone 51. The chamber 45 is also contacted of a unitary, monolithic layer of PBN. In this embodiment, the chamber 45 has a flat configuration which is thinner, but wider than the chamber 24. The source head 53 has a capacitive coupled RF plate 52 which is disposed adjacent the inner side wall 48 to deliver energy to the reaction zone 51 of the chamber 45. End plate 53 has a plurality of apertures 54 which are aligned with outlet orifices 50. Also in this embodiment, the tube portion 43 is braze connected directly to the cooled, stainless steel gas inlet tube 54.

In use the chamber 24 and 45 are typically oriented upwardly at an angle for MBE. The unibody plasma chamber of this invention provides the following advantages: (1) minimization of gas leakage, (2) optimization of output aperture number and output aperture diameter, (3) increase in stability, (4) increase in the partial pressure of the active species of the subject gas in the growth chamber mix, (5) increase in growth yield rate on the order of from 0.25–0.75 µ per hour, and (6) stable at high temperatures for high purity.

3. Chamber Method of Construction.

The chambers 24 and 45 described above are constructed of PBN by chemical vapor deposition. In chemical vapor deposition, PBN is produced by introducing gaseous boron trichloride, ammonia and a diluant into a growth chamber at a submillimeter pressure and a temperature of approximately 1800 degrees Celsius (C.). The PBN yielded from the reaction of compounds is deposited on a forming mandrel (not shown). Upon completion of the CVD process, the formed chamber structure is separated from the mandrel. The mandrel is formed of graphite, preferably a fine grained, high density, pre-purified graphite, and has a hollow, bored out center. Graphite begins to oxidize at approximately 300 degrees C. The dimensions of the mandrel are dependent on the dimensions of the chamber to be formed.

The process of manufacturing the chamber of the present invention comprises the following steps. The mandrel assembly is placed in a CVD growth chamber. CVD coating of PBN then occurs via a process generally known in the art. After the high temperature growth process is completed, the resultant mandrel/container assembly is cooled. After cooling is complete, the assembly is moved to a separate oxidation chamber to remove the mandrel. An air injector is inserted into the center cavity of the mandrel. The assembly is heated at a temperature above 300 degrees C., preferably 750 degrees C., for a predetermined period of time, preferably approximately 40 hours, to oxidize the mandrel which is now disposed inside the formed PBN chamber 24. The flow of air into the heated mandrel is adjusted via the injector to optimize oxidation. Oxidization destroys the mandrel, which would otherwise not be able to be removed due to the enclosing wall portions of the newly formed chamber. As PBN has a higher oxidation temperature, being stable in air up to approximately 1,200 degrees C., it does not oxidize during the heating step of the process. The process yields a unibody, monolithic chamber.

The descriptions above and the accompanying drawings should be interpreted in the illustrative and not the limited sense. While the invention has been disclosed in connection with the preferred embodiment or embodiments thereof; it should be understood that there may be other embodiments which fall within the spirit and scope of the invention as defined by the following claims. Where a claim is expressed as a means or step for performing a specified function it is intended that such claim be construed to cover the corresponding structure, material, or acts described in the specification and equivalents thereof; including both structural equivalents and equivalent structures.

The invention claimed is:

1. A gas plasma apparatus comprising:
   (a) a plasma chamber having proximal and distal ends and including:
      (i) a cylindrical bulb portion formed in one-piece and constructed of pyrolytic boron nitride (PBN) and having a predetermined configuration defining an interior reaction zone, said bulb portion having at least one effusion orifice disposed at said distal end and a gas inlet opening disposed at said proximal end opposite from said at least one effusion orifice; and
      (ii) an elongated, tublar inlet portion extending a predetermined distance proximally from said bulb portion at said gas inlet opening;
   (b) a baffle disposed in said inlet portion;
   (c) a connector constructed of a refractory metal said connector being connected to a proximal end of said inlet portion;
   (d) a non-PBN, elongated gas source tube connected to a proximal end of said connector, said connector creating a hermetic seal between said plasma chamber and said gas source tube; and
   (e) an RF source disposed exteriorly to said plasma chamber for cracking gas in said reaction zone thereof, whereby said baffle creates a high pressure gas zone proximally of said baffle and a low pressure gas zone distally of said baffle so that plasma is contained in said reaction zone.

2. The apparatus of claim 1, wherein said cylindrical bulb portion is longitudinally elongated.

3. The apparatus of claim 1, wherein said cylindrical bulb is laterally elongated.

4. The apparatus of claim 1, wherein said RF source is an inductive coupled coil.

5. The apparatus of claim 1, wherein said RF source is a capacitive coupled plate.

6. The apparatus of claim 1, further comprising a shield disposed exteriorly about said bulb portion, said connector, said gas source and said RF source.

* * * * *